United States Patent [19]

Johansson et al.

[11] Patent Number: 5,488,252
[45] Date of Patent: Jan. 30, 1996

[54] LAYOUT FOR RADIO FREQUENCY POWER TRANSISTORS

[75] Inventors: Ted Johansson, Hagersten, Sweden; Larry Leighton, Santa Cruz, Calif.; Ivar Hamberg, Stockholm, Sweden

[73] Assignee: Telefonaktiebolaget L M Erricsson, Stockholm, Sweden

[21] Appl. No.: 291,427

[22] Filed: Aug. 16, 1994

[51] Int. Cl.[6] .......................... H01L 27/095; H01L 23/58
[52] U.S. Cl. .......................... 257/579; 257/578; 257/584; 257/587
[58] Field of Search .................. 257/578, 579, 257/584, 587

[56] References Cited

U.S. PATENT DOCUMENTS

| | | | |
|---|---|---|---|
| 3,576,476 | 4/1971 | Emmasingel | 317/235 |
| 3,582,726 | 6/1971 | Gilbert et al. | 317/235 |
| 3,742,319 | 6/1973 | Bryan et al. | 257/581 |
| 4,161,740 | 7/1979 | Frey | 357/36 |
| 4,236,171 | 11/1980 | Shen | 357/68 |
| 4,370,670 | 1/1983 | Nawata et al. | 357/36 |
| 4,682,197 | 7/1987 | Villa et al. | 357/36 |
| 4,835,588 | 5/1989 | Nawata et al. | 357/36 |
| 4,994,880 | 2/1991 | Kato et al. | 357/34 |
| 5,010,383 | 4/1991 | Wataguchi | 357/36 |
| 5,023,189 | 6/1991 | Bartlow | 437/8 |
| 5,329,156 | 7/1994 | Bartlow | 257/579 |

*Primary Examiner*—Ngân V. Ngô
*Attorney, Agent, or Firm*—Burns, Doane, Swecker & Mathis

[57] ABSTRACT

A layout is provided for RF power transistors that reduces common lead inductance and its associated performance penalties. An RF transistor cell is rotated 90° with respect to a conventional RF transistor cell so as to located bond pads nearer the edge of a silicon die, reducing bond wire length and common lead inductance and thereby improving performance at high frequencies. The placement of bond pad and distribution of different parts of the transistor layout further reduces common lead inductance.

8 Claims, 6 Drawing Sheets

▩ OXIDE
▨ EMITTER DIFFUSION
▧ P+, BASE DIFFUSION
— METAL

LAYOUT FOR RADIO FREQUENCY POWER TRANSISTORS

BACKGROUND OF THE INVENTION

1. Field of the Invention

The present invention relates to power transistors, more particularly to radio frequency (RF) power transistors of the silicon bipolar type. Such transistors are commonly used in amplification stages for radio base station amplifiers, but are also widely used in other RF-related applications.

2. State of the Art

Transistor devices used for power amplifications at high frequencies need to meet numerous detailed requirements for output power, gain, ruggedness, efficiency, stability, bandwidth, etc., at a specified supply voltage and operating frequency. The operating frequencies for modem telecommunication electronics range from several hundred megahertz up into the microwave region. The output power requirements range from a few watts up to several hundred watts, using many paralleled devices in one package. Power transistors operate at large signal levels and high current densities. Computer tools presently available are often not sufficient to predict detailed behavior or performance in real applications.

The semiconductor material most commonly used for power transistors (at least for frequencies below 3 GHz) is silicon. Furthermore, because of the higher mobility of electrons as compared to holes, virtually all microwave bipolar transistors are of the NPN type. Epitaxial n on n+wafers are used as a starting material to reduce collector series resistance. An insulating layer is formed on the semiconductor surface, and base and emitter layers are formed by diffusion or ion implantation. Different doping profiles produce different frequency and breakdown voltage characteristics, and different horizontal geometries produce transistors of different current capabilities.

Figure 1:
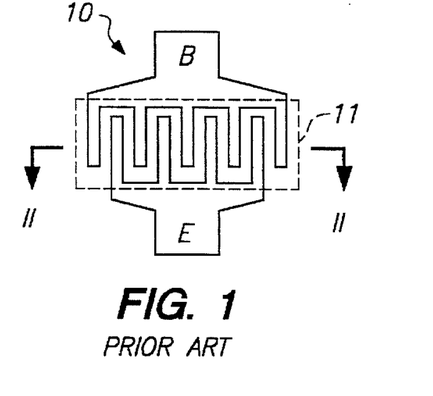
FIG. 1 is a plan view of an interdigitated RF power transistor geometry.
Figure 2:
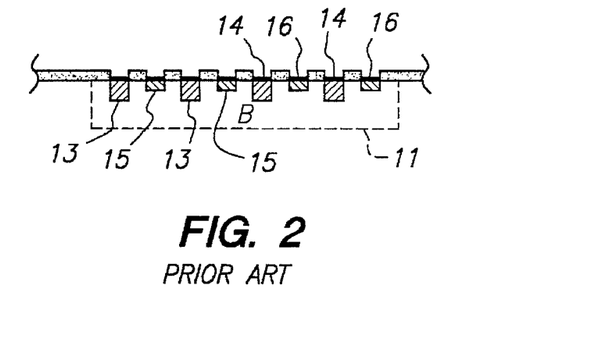
FIG. 2 is a cross-sectional view of the RF power transistor of FIG. 1.

Interdigitated, overlay and mesh structures have been used to reduce the dimensions of the active areas of power transistors and reduce parasitics, to handle and distribute the large amount of current in the transistor, and to provide heat spreading. An interdigitated structure 10 is shown in FIGS. 1 and 2. Referring to FIG. 1, a pair of interdigitated base and emitter electrodes B and E, respectively, are deposited above an oxide layer overlying a collector diffusion region 11, indicated by dashed lines. As shown in FIG. 2, within the collector diffusion region 11 are located alternating base diffusion regions 13 and emitter diffusion regions 15 underlying the fingers of the base and emitter electrodes B and E, respectively. A transistor is formed by the collector substrate (N), a base diffusion region (P) and an emitter diffusion region (N). Metal emitter fingers 14 are deposited over the emitter diffusion regions and metal base fingers 16 are deposited over the base diffusion regions. All of the base fingers and all of the emitter fingers, respectively, are connected together such that all of the individual transistors are connected together in parallel.

Figure 3:
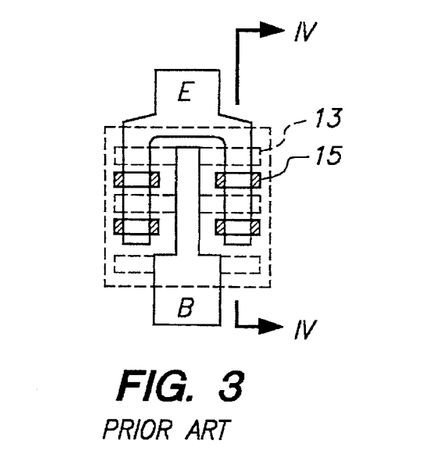
FIG. 3 is a plan view of an overlay RF power transistor geometry.
Figure 4:
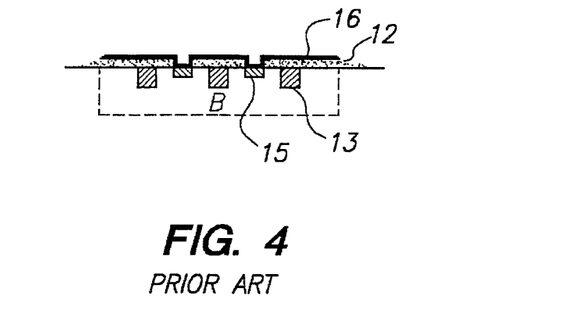
FIG. 4 is a cross-sectional view of the RF power transistor of FIG. 3.

Referring to FIGS. 3 and 4, the overlay structure differs from the interdigitated structure in that the diffusion regions (base and emitter) and the electrode fingers (base and emitter) are transverse to one another. The emitter electrode fingers are overlaid directly on the emitter diffusion regions and are separated from the base diffusion regions by a oxide layer The emitter diffusion regions are discontinuous so as to allow a base finger to pass between adjacent emitter diffusion regions and connect to different base diffusion regions. The base diffusion regions are continuous.

Figure 5:
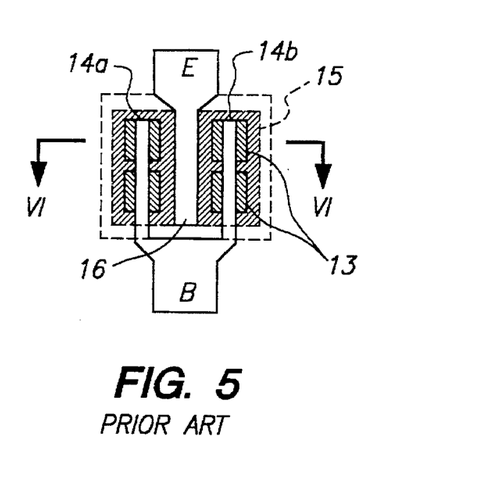
FIG. 5 is a plan view of a mesh RF power transistor geometry.
Figure 6:
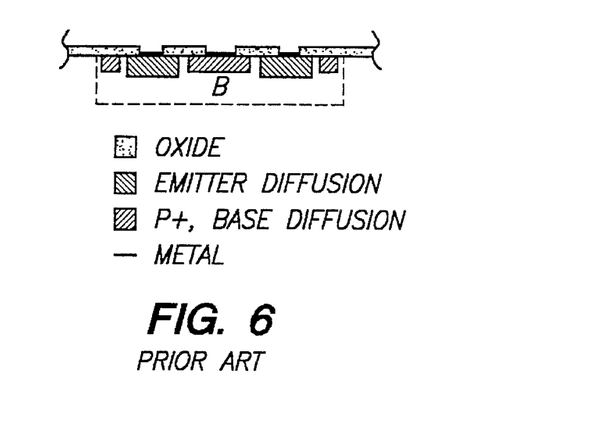
FIG. 6 is a cross-sectional view of the RF power transistor of FIG. 5.

Referring to FIGS. 5 and 6, in a typical mesh structure power transistor, base diffusion islands 13 are formed within a surrounding emitter diffusion region 15. Two base diffusion regions are joined by adjacent base electrode fingers 14a and 14b on either side of an emitter electrode finger 16.

The physical dimensions and the internal metallization patterns of the RF power package in which a silicon die is placed affect the overall performance of the packaged transistor. As the operating frequency increases, degradation occurs in the overall performance of the packaged transistor. The causes of this degradation in performance are found in the silicon die and the transistor package, as well as the connections from the silicon die to the transistor package. Connection of the silicon die to the RF package is accomplished by a physical eutectic connection of the die to the package, and by connection of wires from the die to the appropriate lead of the RF package.

Often, the silicon die are operated in the attenuation region of the common-emitter gain curve so that a minor increase in the operating frequency can cause considerable degradation of gain and output power. Also, parasitic losses in the die increase with frequency.

As the operating frequency increases, the RF power transistor's package has the greatest influence on total performance. One of the main causes of performance degradation is common lead inductance of the emitter wires and package. At higher frequencies, the distance between the input and the output is generally decreased to minimize the amount of internal impedance matching required and to minimize common lead inductance to ground.

The common lead may be considered to be that lead which has the majority of the input and output current flowing through it. Common lead inductance refers to the inductance of the common lead caused by the length of the wire which connects the common element to ground. Although in some instances common lead inductance may actually be used to enhance performance, most often it degrades performance.

One of the dominant contributors to common lead inductance is the bonding wire between the emitter bond pad and common lead of the RF package. In the case of a common-emitter amplifier, the common lead of the package is the emitter lead.

Figure 7:
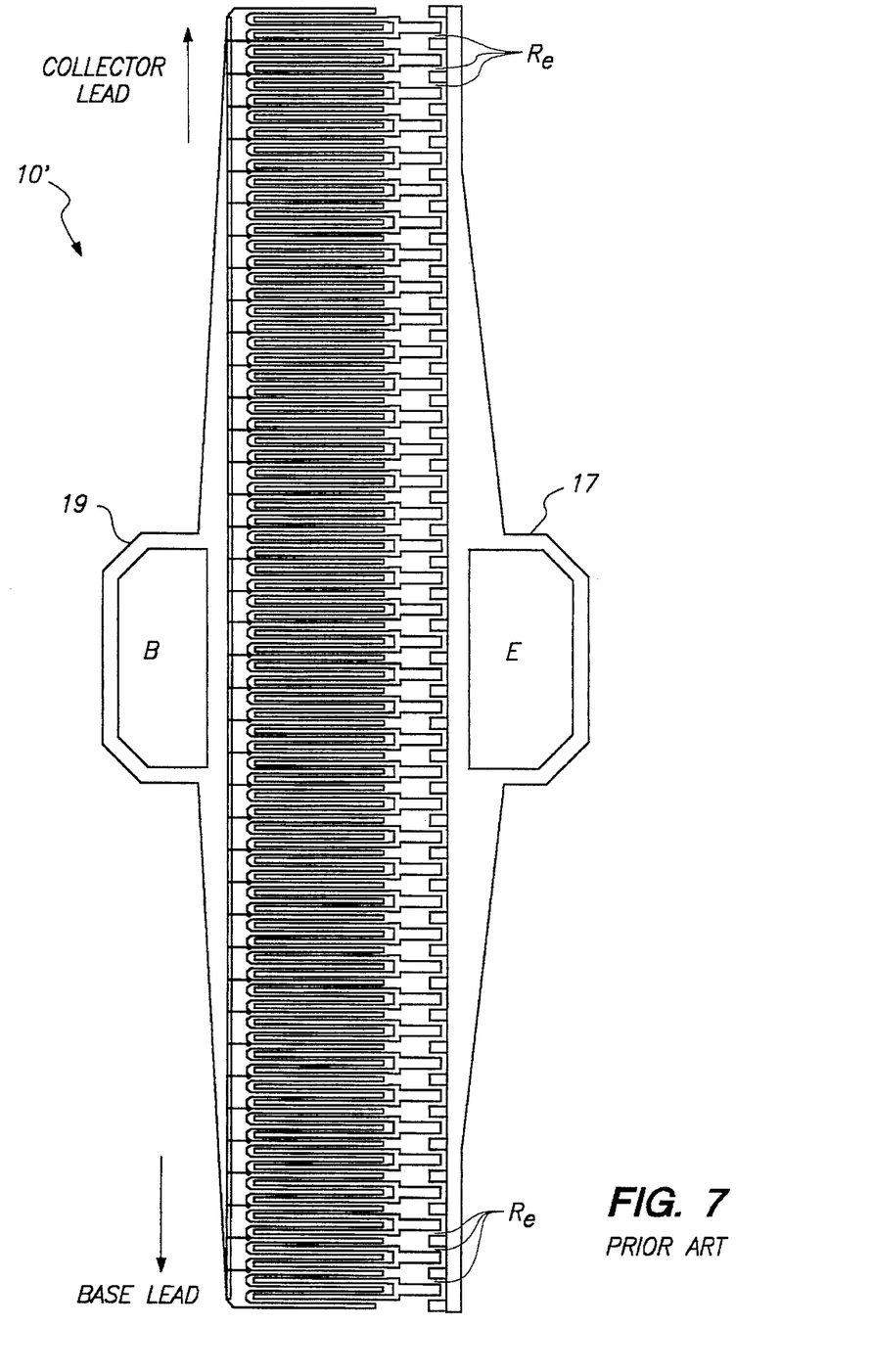
FIG. 7 is a plan view of a conventional layout of an RF power transistor of the interdigitated type.

A traditional metallization layout of a silicon cell 10' is shown in FIG. 7. Because of thermal instability in bipolar transistors, techniques must be used to evenly distribute the current in the transistor. Resistance is therefore added to each segment of the transistor, such that an increase in current through a particular emitter will be limited by the resistor. This technique is known as emitter ballasting. A resistor Re is formed in series with each emitter finger, either by diffusion, ion implantation, or deposition of a suitable metal (e.g., nickel-chromium, NiCr) on top of the silicon dioxide. All of the resistors are joined together by the emitter electrode E. An emitter bond pad 17 provides for bonding of a wire to the emitter electrode E. Similarly, all of the base fingers are joined together by the base electrode B, and a base bond pad 19 provides for bonding of a wire to the base electrode B.

As seen in FIG. 7, traditional silicon cell metallization layouts place the base and emitter bond pads 17 and 19 in the center of the cell 10'. Current is therefore coupled from the power supply to the base pad 19 over a distance. The emitter current consists of the combination of the base current and the collector current, which flows through the load to produce an output signal. The emitter current is coupled from the emitter pad 17 to ground over the same distance. Because of the length of the emitter wire and its proximity to the base wire, there is feedback of the load current to the source as a result of mutual inductive coupling of the base and emitter wires. Although a small amount of feedback current can be advantageous, if the length of the of emitter wire is long, deleterious effects occur. With the emitter pad in the center of the cell, the emitter wire must be at least as long as from the appropriate lead of the RF package to the center of the cell.

Figure 8:
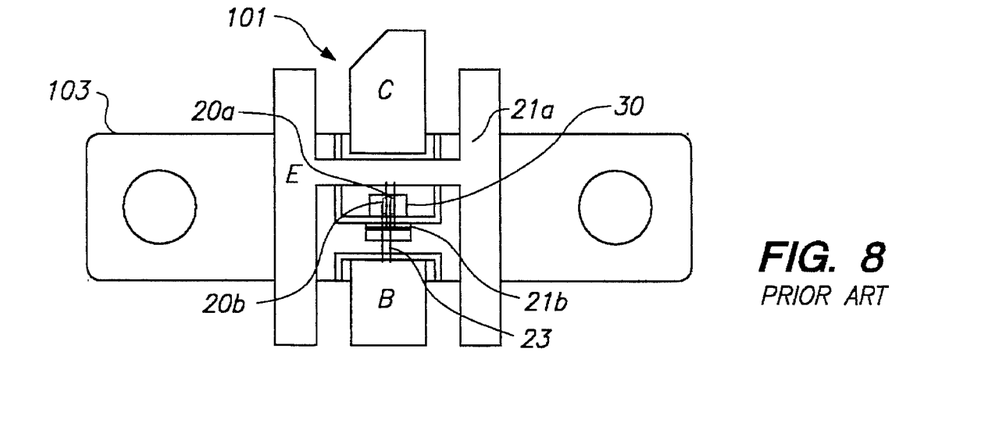
FIG. 8 is a plan view of a conventional multi-cell RF transistor mounted in a transistor package.

Furthermore, in conventional cell layout, more than one cell is located on a single block of silicon in order to conserve silicon. These cells are generally aligned such that the base and emitter wires of each cell are located in close proximity to each other. In FIG. 8, two transistor cells 20a and 20b occupy a single silicon die 30. The silicon die 30 is bonded to a "pill" 101 comprising a substrate (typically beryllium oxide) to which base, collector and emitter leads B, C and E are bonded. Chip capacitors and other elements used for impedance matching may also be bonded to the pill. The pill 101 is bonded in turn to a flange 103.

Figure 9:
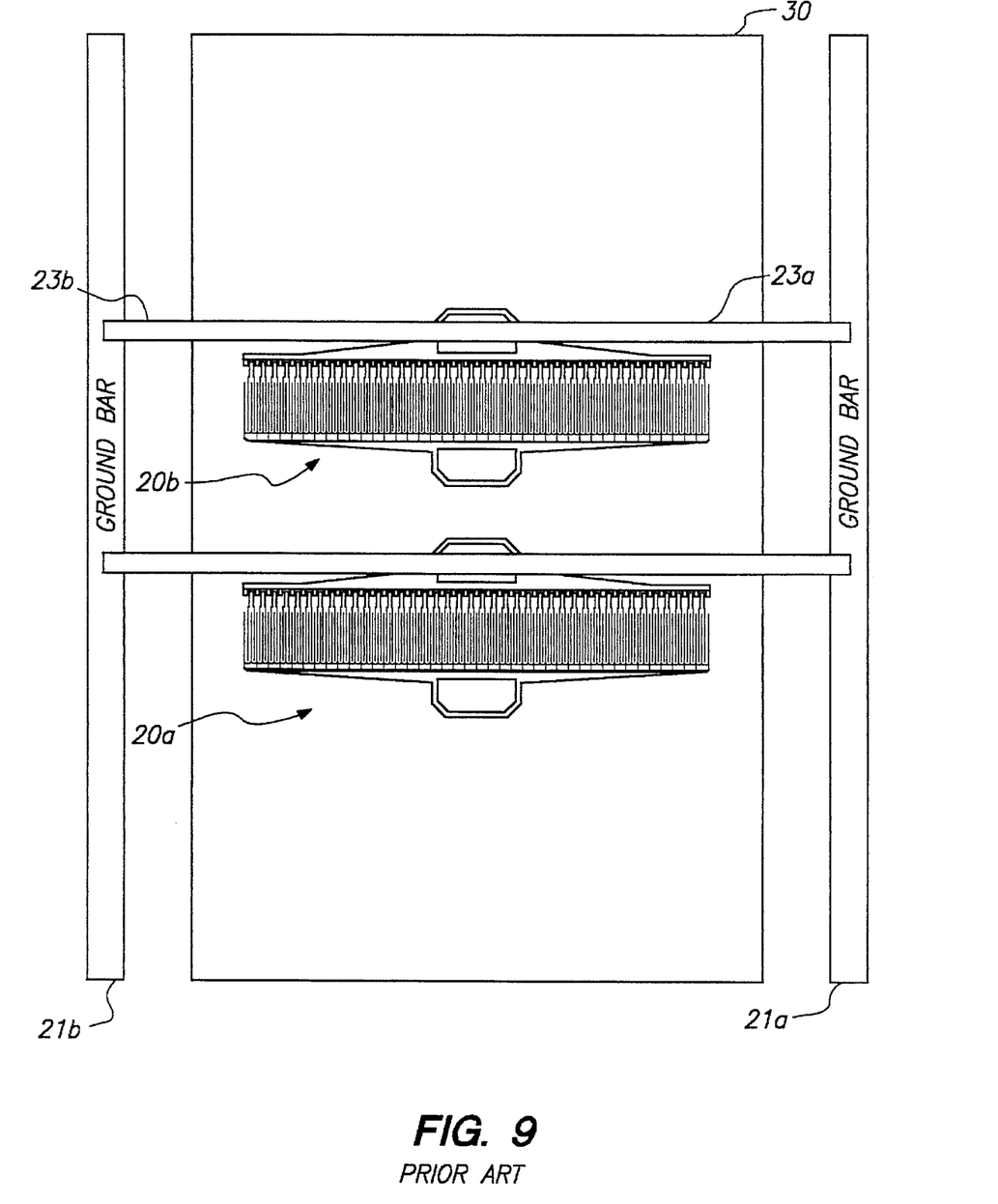
FIG. 9 is an enlarged plan view of a portion of FIG. 8, showing a conventional multi-cell RF power transistor and lead connections to the transistor package.

As shown in greater detail in FIG. 9, ground bars 21a and 21b are provided on two opposite sides of the die as part of the transistor package. In the case of the emitter bonding pads, two wires are connected to each emitter bonding pad, one (23a) from one of the ground bars and another (23b) from the opposite ground bar.

Referring again to FIG. 8, in the case of the base bonding pads, a single wire 23 is connected from each bonding pad to the base lead of the transistor package. When the emitter wires and the base wires are connected as shown in FIG. 8, in many cases the emitter wire is located sufficiently close to the base wire of the adjacent cell to couple false feedback currents to the adjacent cell via mutual inductive coupling.

SUMMARY OF THE INVENTION

The present invention, generally speaking, provides a layout for RF power transistors that reduces common lead inductance and its associated performance penalties. An RF transistor cell is rotated 90° with respect to a conventional RF transistor cell so as to locate bond pads nearer the edge of a silicon die, reducing bond wire length and common lead inductance and thereby improving performance at high frequencies. The placement of bond pads and the distribution of different parts of the transistor layout further reduces common lead inductance. More particularly, in accordance with one embodiment of the invention, an RF power transistor includes a silicon die and a pair of interdigitated electrodes formed on the silicon die, each electrode having a multiplicity of parallel electrode fingers and each including at least one bond pad. Regions of a first type of diffusion are formed beneath electrode fingers of one electrodes, and regions of a second type of diffusion are formed beneath electrode fingers of another electrode. A first wire is connected to a bond pad of the one electrode and extends in a direction predominantly parallel to the electrode fingers of the one electrode. A second wire is connected to a bond pad of the other electrode and extends in a direction predominantly parallel to the electrode fingers of the other electrode. The silicon die is substantially rectangular and has a least dimension in a direction substantially parallel to the electrode fingers of the pair of interdigitated electrodes. The pair of interdigitated electrodes may each include a plurality of bond pads connected to additional wires, one wire for each of the bond pads of each electrode. Preferably, all of the wires are substantially parallel, and the bond pads of the one electrode are spaced apart at substantially equal intervals. Each bond pad of the other electrode is then located substantially in the center of one of the intervals.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

Figure 10:
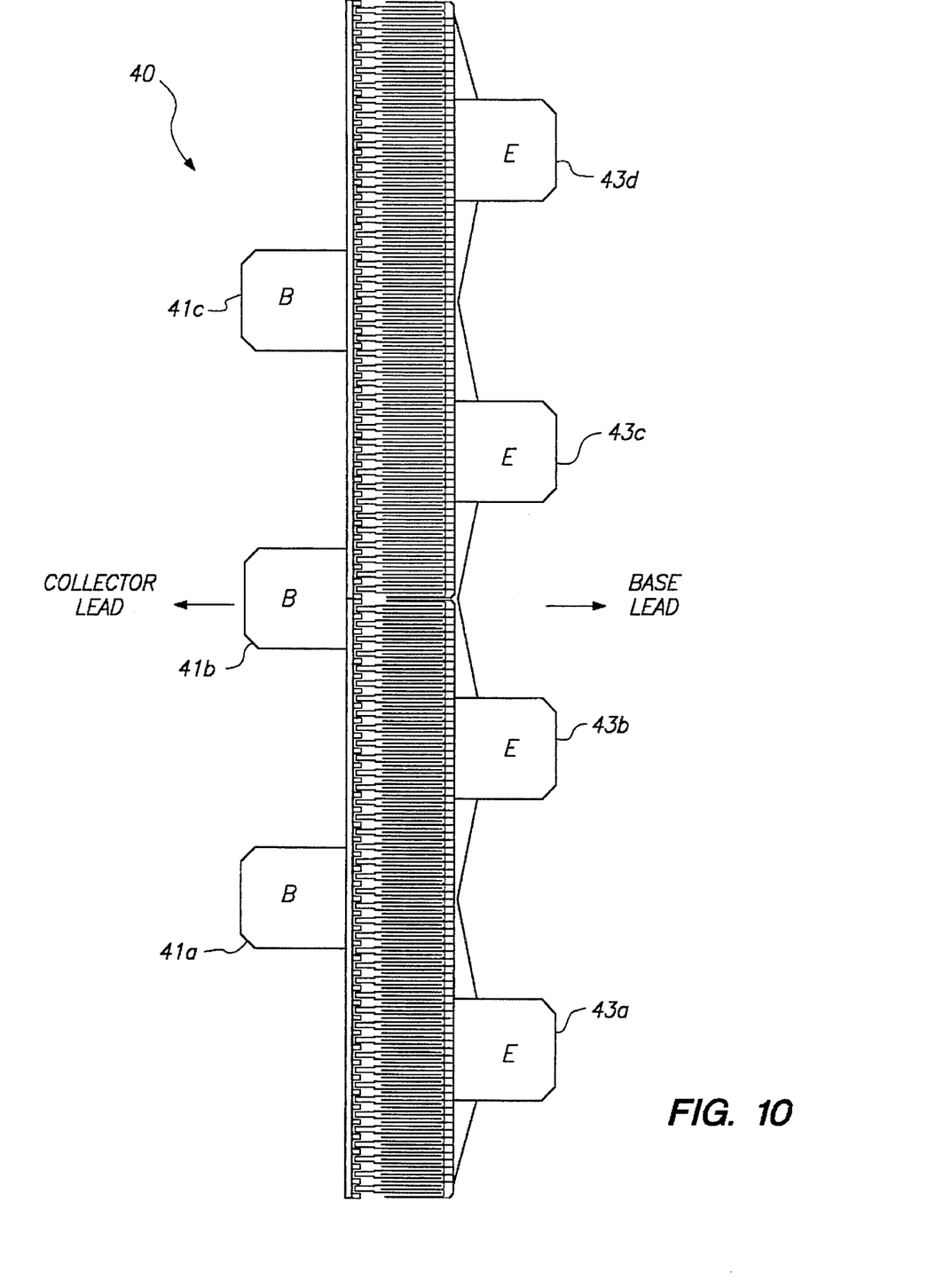
FIG. 10 is a plan view of an interdigitated single-cell RF power transistor in accordance with one embodiment of the present invention.

Referring to FIG. 10, a plan view of a single-cell RF power transistor 40 in accordance with the present invention is shown. As compared to a conventional layout of an RF power transistor of the interdigitated type, the present transistor cell is rotated 90° with respect to the collector and base leads (not shown) of the transistor package. The individual transistors, instead of being arrayed in a column between the collector and base leads, are arrayed in a row extending in-between the collector and base leads. Furthermore, instead of a single base pad and a single emitter pad, the present transistor cell has multiple base pads 41 and multiple emitter pads 43. In the illustrated embodiment, the transistor cell has three base pads (41a, 41b, and 41c) and four emitter pads (43a, 43b, 43c and 43d). The base pads 41 and the emitter pads 43 are staggered, maximizing the distance between them. Although not shown, overlay and mesh transistor cells may be laid out in substantially the same pattern.

Figure 11:
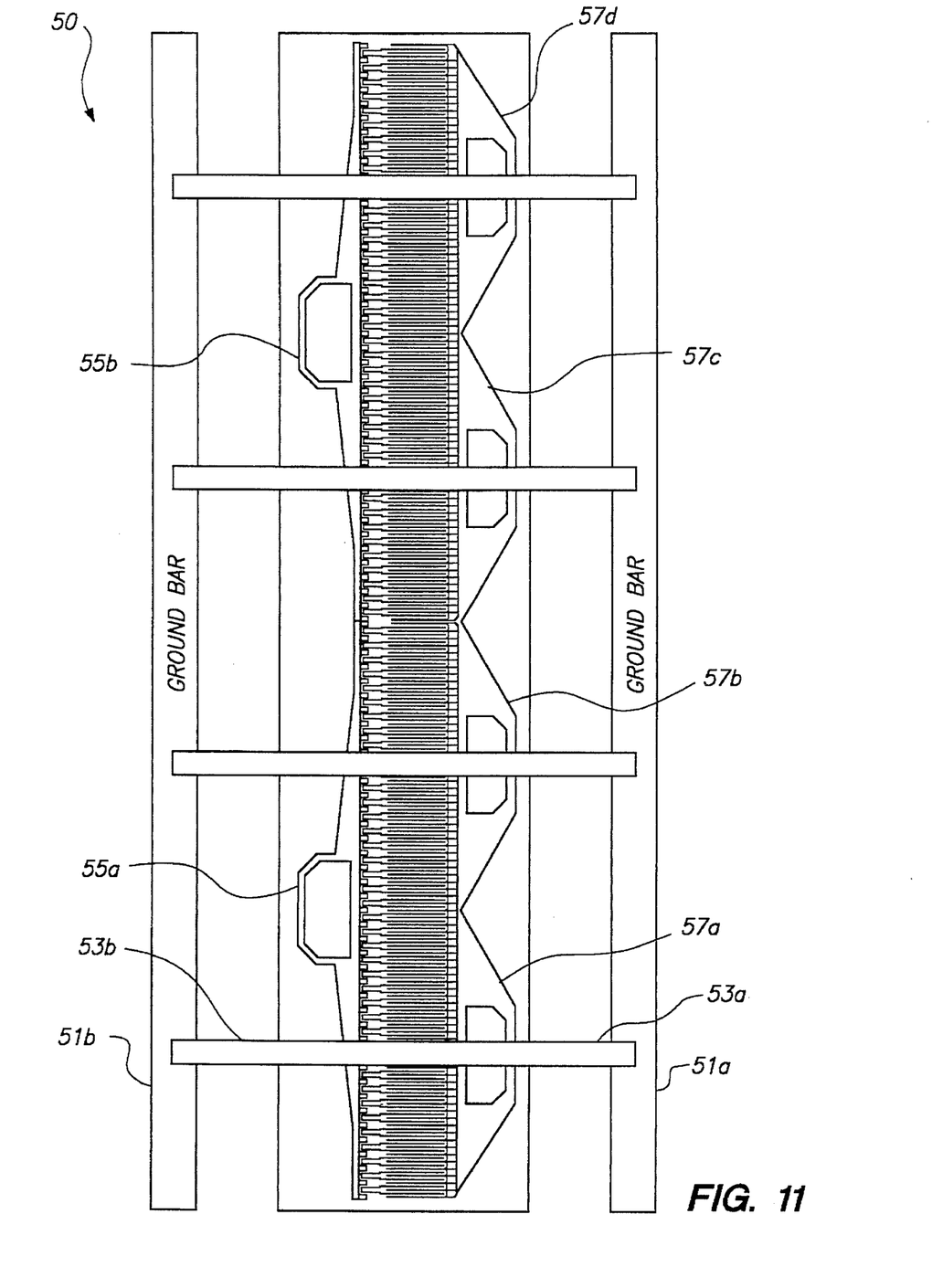
FIG. 11 is an enlarged plan view of an interdigitated single-cell RF power transistor and lead connections to a transistor package in accordance with the present invention.

The number of base pads and the number of emitter pads may vary. Referring to FIG. 11, a single-cell RF power transistor 50 is provided with two base pads (55a, 55b) and four emitter pads (57a, 57b, 57c and 57d). Two wires are connected to each emitter bonding pad, one (53a) from a ground bar 51a and another (53b) from an opposite ground bar 51b. As compared to the conventional dual-cell transistor layout of FIG. 9, the number of emitter pads, and hence the number of emitter wires, is doubled for the same amount of active area. Furthermore, because the emitter pads are located at the edge of the silicon die rather than in the center of the silicon die, the emitter wires in FIG. 14 are about half the length of the emitter wires in the conventional layout of FIG. 9. These two factors combined reduce the effective emitter inductance of the present transistor to about ¼ that of the conventional geometry.

Figure 12:
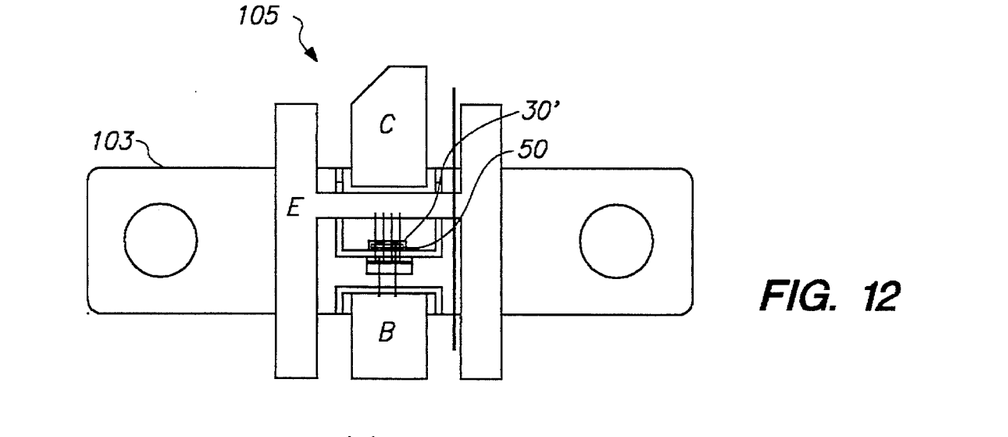
FIG. 12 is a plan view of the power transistor of FIG. 11 mounted in a transistor package.

FIG. 12 shows the power transistor 50 of FIG. 11 mounted in a transistor package. The silicon die 30' has a smaller area than and a flattened aspected ratio as compared to the silicon die 30 of FIG. 8. The pill 105 differs in only minor respects from the pill 101 of FIG. 8, and the flange 103 is unchanged.

The described cell arrangement also has other desirable properties that contribute to increased performance. In particular, the present transistor layout improves heat dissipation of the transistor. The output power of the transistor is related to the efficiency with which heat can be dissipated from the transistor. With two cells arranged in parallel as in a conventional RF power transistor, a thermal cone having an angle of approximately 45° extends from the center of each cell to the heat sink to which the transistor is mounted. In order to avoid degradation in thermal performance, the thermal cones must not intersect one another, the edge of the silicon, or the edges of the transistor package in order to allow heat to be conducted both vertically and horizontally instead of only vertically.

Figure 13:
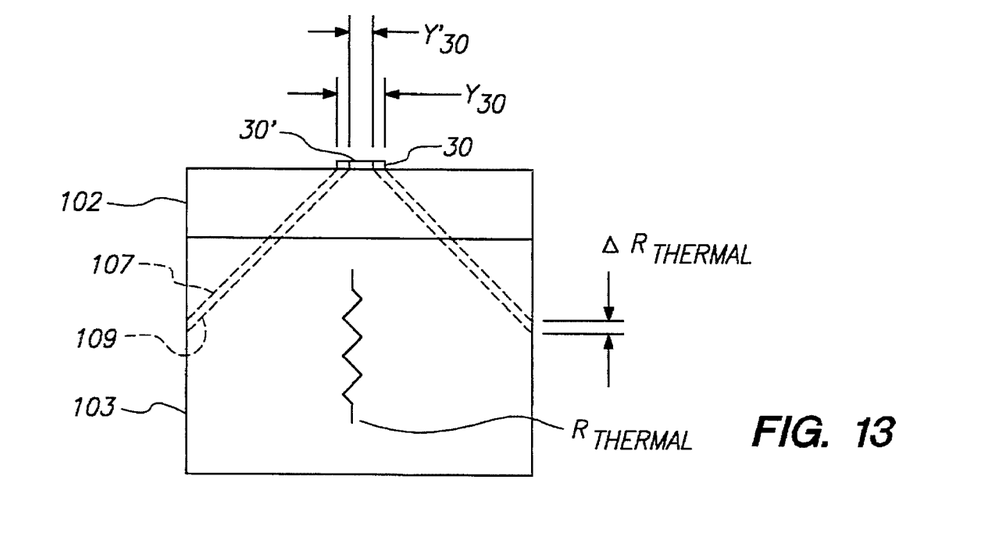
FIG. 13 is a diagram comparing thermal characteristics of the RF power transistors of FIG. 8 and FIG. 12.

With the cell rotated 90°, the heat cone is less likely to intersect with the edges of the package, which is reduced in dimension between the input and the output as illustrated in FIG. 13. FIG. 13 represents an end view of a transistor package including a substrate 102 and a flange 103. In the first instance, a conventional silicon die 30 having a first aspect ratio and a first dimension $Y_{30}$ in the direction from the base lead to the collector lead (both not shown) is assumed to be mounted on the substrate. Heat from the silicon die 30 will radiate down through the substrate and the flange in a cone-shaped pattern 107. The thermal resistance presented to the silicon die 30 by the substrate and the flange is represented by a resistor $R_{thermal}$.

In the second instance, a silicon die 30' having a second aspect ratio and a second dimension $y_{30}$ in the direction from the based lead to the collector lead is assumed to be mounted on the substrate. Heat from the silicon die 30' will radiate down through the substrate and the flange in a cone-shaped pattern 109. The heat cone 109 of the silicon die 30' does not intersect the edge of the package as quickly as the heat cone of the conventional silicon die 30. As a result, the thermal resistance is decreased by an amount $\Delta R_{thermal}$ related to vertical distance between the heat cones 107 and 109.

The reduced emitter lead inductance and reduced false feedback currents of the present transistor layout increase the gain of the transistor. Increased thermal performance increases the output power of the transistor. Increased gain and output power resulting from the present layout have been observed experimentally. Devices were fabricated in an RF process designed for 1800 to 1900 Mhz operation. A 2.5 dB increase in gain was achieved compared to devices from the same wafer using standard layouts. Furthermore, devices using the new layout were significantly (approximately 17%) smaller (in active area) than the devices using standard layouts but were able to deliver the same output power as the larger devices.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. An RF power transistor comprising:

a silicon die;

a pair of interdigitated electrodes formed on the silicon die, each electrode having a multiplicity of parallel electrode fingers and each including at least one bond pad;

regions of a first type of diffusion formed beneath electrode fingers of one electrode of the pair of interdigitated electrodes, and regions of a second type of diffusion formed beneath electrode fingers of another electrode of the pair of interdigitated electrodes;

a first wire connected to a bond pad of said one electrode and extending in a direction predominantly parallel to the electrode fingers of the one electrode;

and a second wire connected to a bond pad of said another electrode and extending in a direction predominantly parallel to the electrode fingers of said another electrode;

wherein the silicon die is substantially rectangular and has a least dimension in a direction substantially parallel to the electrode fingers of the pair of interdigitated electrodes, and wherein at least one of the pair interdigitated electrodes includes a plurality of bonds pads, the apparatus further comprising at least one additional wire such that one wire is connected to each of said bond pads of each electrode.

2. The apparatus of claim 1, wherein all of the wires are substantially parallel.

3. The apparatus of claim 1, wherein the plurality of bond pads of said one electrode are spaced apart at substantially equal intervals.

4. The apparatus of claim 3, wherein each bond pad of said another electrode is located substantially in the center of one of said intervals.

5. An RF power transistor comprising:

a substrate;

a collector lead formed at one side of the substrate and a base lead formed at an opposite side of the substrate;

a silicon die;

a pair of interdigitated electrodes formed on the silicon die, each electrode having a multiplicity of parallel electrode fingers extending in substantially a same direction as a direction between the collector lead to the base lead, each electrode including at least one bond pad; and regions of a first type of diffusion formed beneath electrode fingers of one electrode of the pair of interdigitated electrodes, and regions of a second type of diffusion formed beneath electrode fingers of another electrode of the pair of interdigitated electrodes; and a first wire connected to a bond pad of said one electrode and extending in said same direction; and a second wire connected to a bond pad of said another electrode and extending in said same direction;

wherein the silicon die is substantially rectangular and has a least dimension in a direction substantially parallel to the electrode fingers of the pair of interdigitated electrodes, and wherein at least one of the pair of interdigitated electrodes includes a plurality of bond pads, the apparatus further comprising at least one additional wire such that one wire is connected to each of said bond pads of each electrode.

6. The apparatus of claim 5, wherein all of the wires are substantially parallel.

7. The apparatus of claim 5, wherein the plurality of bond pads of said one electrode are spaced apart at substantially equal intervals.

8. The apparatus of claim 7, wherein each bond pad of said another electrode is located substantially in the center of one of said intervals.

* * * * *